United States Patent [19]

Watabe et al.

[11] Patent Number: 5,836,156
[45] Date of Patent: Nov. 17, 1998

[54] DRIVING DEVICE OF SENSORS AND ACTUATORS

[75] Inventors: Mitsuru Watabe, Urizura-machi; Hideaki Ishikawa, Mito, both of Japan

[73] Assignee: Hitachi, Ltd., Japan

[21] Appl. No.: 529,492

[22] Filed: Sep. 18, 1995

[30] Foreign Application Priority Data

Sep. 16, 1994 [JP] Japan .................................. 6-221390

[51] Int. Cl.⁶ ........................................................ F01N 3/00
[52] U.S. Cl. ............................ 60/276; 60/277; 324/537; 123/688
[58] Field of Search ........................... 60/276, 277, 274; 73/118.2; 324/418, 522, 555, 713, 718; 123/688, 571

[56] References Cited

U.S. PATENT DOCUMENTS

| | | | |
|---|---|---|---|
| 3,110,019 | 11/1963 | Fath | 324/418 |
| 3,472,068 | 10/1969 | List | 60/277 |
| 4,162,478 | 7/1979 | Huber et al. | 324/51 |
| 4,479,161 | 10/1984 | Henrich | 123/490 |
| 4,571,689 | 2/1986 | Hildebrand | 324/537 |
| 4,617,510 | 10/1986 | Deicke et al. | 324/51 |
| 5,056,023 | 10/1991 | Abe | 73/117.3 |
| 5,122,968 | 6/1992 | Bauer | 324/537 |
| 5,172,062 | 12/1992 | Eisermann | 324/503 |
| 5,396,765 | 3/1995 | Maruyama | 123/688 |
| 5,444,977 | 8/1995 | Kawabata | 60/276 |
| 5,477,544 | 12/1995 | Botelho | 324/555 |

FOREIGN PATENT DOCUMENTS

| | | |
|---|---|---|
| 282757 | 9/1990 | Germany . |
| WO85/04005 | 9/1985 | WIPO . |

*Primary Examiner*—Thomas E. Denion
*Attorney, Agent, or Firm*—Evenson, McKeown, Edwards & Lenahan, P.L.L.C.

[57] ABSTRACT

A driving device for a plurality of sensors or a plurality of actuators comprises a measuring unit for measuring currents flowing through the sensors or the actuators, and a switching arrangement for selectively energizing the sensors or the actuators. The driving device measures a current flowing through each of the sensors or the actuators by means of a single measuring unit, which is time shared.

8 Claims, 7 Drawing Sheets

DRIVING DEVICE OF SENSORS AND ACTUATORS

BACKGROUND OF THE INVENTION

This invention relates to a driving device for controlling the operation of a plurality of sensors and actuators of the type which are used, for example, for engine control. Typically such sensors are used to monitor or control operation of respective engine operating systems, by measuring a current which flows through such sensors or actuators.

Conventional control devices for driving such sensors and actuators include separate means for measuring a current flowing through each sensor or each actuator for each switching or control means. Such an arrangement is disclosed, for example, in Japanese Utility Model Publication No. 39071/1974. Because measuring means are provided for measuring the current of a sensor for each switching or control means, such prior art technology has the drawback that the driving device is large and complicated.

SUMMARY OF THE INVENTION

It is an object of the present invention to provide a device for driving sensors and actuators which employs a simple circuit, and can be made compact.

This and other objects and advantages are achieved by the control device according to the invention, which includes switching means for selectively interrogating each of the respective sensors or actuators and measuring the flow of current therein. In this manner, a single measurement device can be used to monitor the flow of current through each of the sensors or actuators. At the same time, the switching and measurement arrangement according to the invention also permits current to flow continuously, or with insignificant interruptions, through each of the respective sensors or actuators, so that its operation is not impaired. In a first embodiment of the invention, current flowing to the respective sensors or actuators is briefly interrupted for all sensors or actuators other than the one being interrogated, so that during such interruption the measurement device receives a signal indicative of current flowing only to the selected sensor or actuator. In another embodiment, current sensing resistors for each of the sensors or actuators are selectively coupled to the measurement device by means of a multiplexer unit. Selection of the sensors or actuators for interrogation, including the timing and sequence thereof, is controlled by a computer.

Other objects, advantages and novel features of the present invention will become apparent from the following detailed description of the invention when considered in conjunction with the accompanying drawings.

DETAILED DESCRIPTION OF THE PREFERRED EMBODIMENTS

Figure 1:
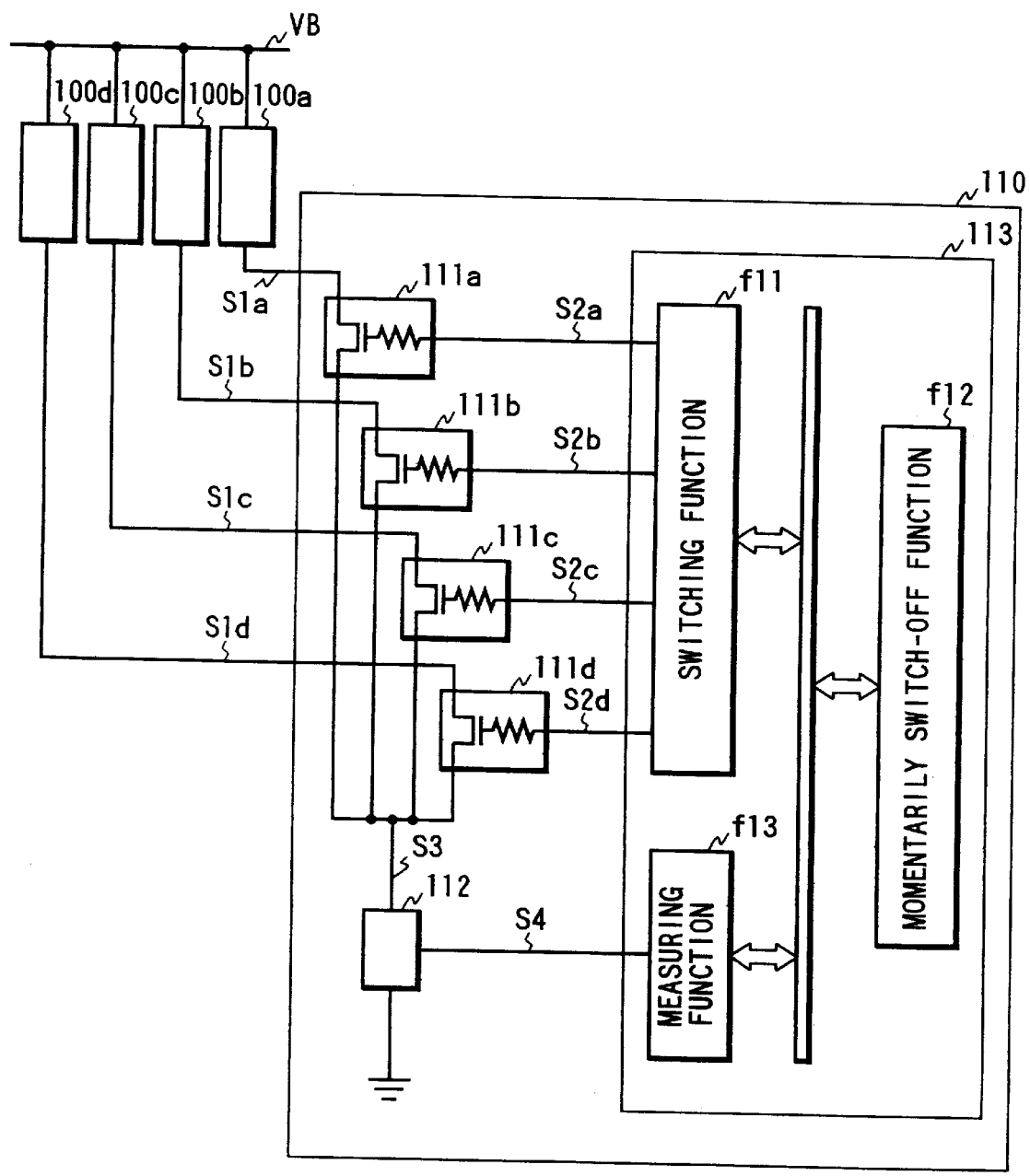
FIG. 1 is a circuit diagram showing a driving device according to an embodiment of the present invention.

FIG. 1 is a circuit diagram showing driving device according to an embodiment of the present invention. Sensors 100*a*, 100*b*, 100*c* and 100*d* are, for example, air-fuel ratio sensors, oxygen sensors and coolant temperature sensors used for engine control, which operate when a current is supplied thereto. The operational status of such sensors can also be determined by the current flow therein. For example, the oxygen sensor generates heat and is activated when a current flows through it. When the sensor deteriorates, the current value changes, so that deterioration can be determined by detecting this current value. Similarly, when a wire of the oxygen sensor is broken the current flow is cut off, which can also be detected by monitoring the current value. In the case of the coolant temperature sensor, the current flowing through the sensor changes with the coolant temperature. Therefore, to detect the coolant temperature, the current value must be detected. When a wire to the coolant temperature sensor is broken, it can be detected by detecting the current, which is cut off. On the other hand, an over-current flows through the driving device during maintenance when a connector is wrongly connected and a short-circuit occurs, or when the sensor is out of order. When such an over-current flows, the driving device is out of order, and normal control of the car cannot be achieved, even when the sensor is replaced by a normal one. To prevent this problem, the sensor current is cut off and the driving device is protected when an over-current is detected. At the same time, this abnormality is reported to the driver.

As described above, the currents of the sensors 100*a*, 100*b*, 100*c*, 100*d* must be measured. The driving device according to the invention can reduce the size of the measuring circuit and simplify its construction.

As shown in FIG. 1, sensors 100*a*, 100*b*, 100*c*, 100*d* are connected to a battery as an electric power source and to the driving device 110, which includes MOS transistors 111*a*, 111*b*, 111*c*, 111*d* that act as switches for each of the respective sensors. Thus, a current flows through each sensor when the associated MOS transistor 111*a*, 111*b*, 111*c*, 111*d* is turned on. The current in the sensors is summed by a wire S3, and flows to ground through a current-to-voltage converter 112, which converts the current to a voltage and outputs it as a measured signal S4. The measured signal S4 is input to a microcomputer 113, and is digitized by an analog-to-digital converter therein. The microcomputer 113 outputs driving signals S2*a*, S2*b*, S2*c* and S2*d* that connect and disconnect the transistors. When each driving signal is greater than a threshold of the MOS transistor, the MOS transistor is turned on and power is supplied to the corresponding sensor.

To conduct self-diagnosis and protection, the current for each sensor must be measured as described above. Because the measured signal S4 as the output of the current-to-voltage converter 112 represents the sum of the current values of the sensors to which power is supplied, in order to interrogate each sensor individually, all the sensors other than the sensor whose current is to be tested must be de-energized. In this manner, only the current through the sensor under test is supplied to the current-to-voltage converter 112, and the measured signal S4 represents the current value of this sensor, which can be measured by the microcomputer 113. Thereafter, the microcomputer 113 restores power to the sensors which have been cut off. It should be noted that the cut off of the sensors which are not the object of measurement is for an extremely short time, which does not significantly impede activation of the sensors or invite temperature change.

The microcomputer 113 can exhibit a switching function f11 for controlling switching of each MOS transistor, a measuring function f13 for controlling analog-to-digital conversion as the measurement of the measured signal S4, and a momentary switch-off function for indicating OFF/ON of each MOS transistor at the same time of measurement and for indicating the measurement. The relationship between these functions will be described later.

Figure 2:
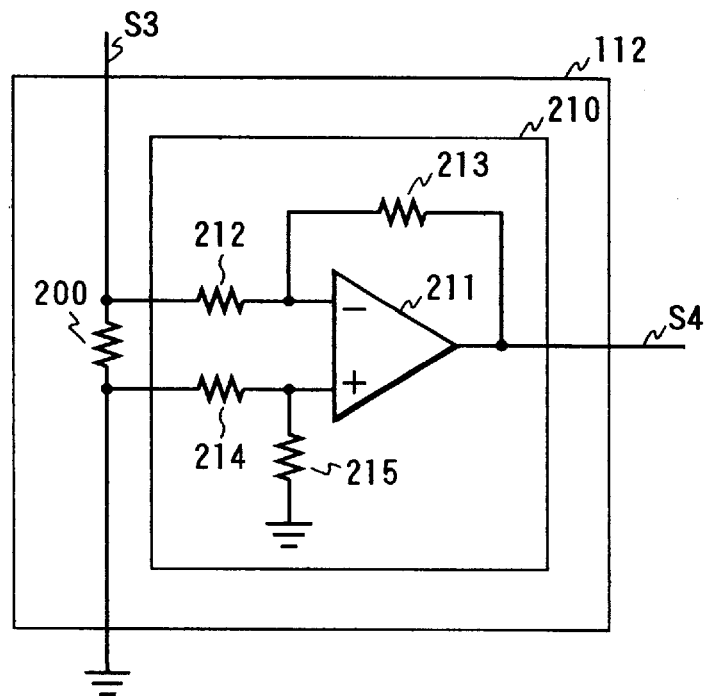
FIG. 2 is a circuit diagram of a current-to-voltage converter of the driving device shown in FIG. 1.

FIG. 2 is a circuit diagram of the current-to-voltage converter 112 of the driving device shown in FIG. 1, which includes a resistor 200 between the wire S3 and ground. Both ends of the resistor 200 are connected to a differential amplifier 210, which also includes resistors 212, 213, 214, 215 and an operational amplifier 211 that amplifies the potential difference between both ends of the resistor, and outputs a measured signal S4.

If the resistance of the resistor 200 is too high, the current flowing through each sensor is reduced and normal sensing becomes impossible. In the case of an oxygen sensor, for example, inadequate current prevents a sufficient rise in temperature to activate it. Moreover, if the resistance value is too high, the resistor 200 burns out. If the resistance value is too small, on the other hand, the amplification of the differential amplifier 210 must be increased in order to input the signal to the analog-to-digital converter of the microcomputer 113. That is, because the analog-to-digital converter of the microcomputer 113 digitizes the input voltage between the power source voltage of the microcomputer 113 and the ground potential by a predetermined number of bits, if the full scale of the input voltage is too small, the quantization error becomes significant. On the other hand, a differential amplifier having a high amplification ratio is likely to oscillate. Accordingly, it is desired to increase the resistance value of the resistor 200 as much as possible and to lower the amplification of the differential amplifier. For example, the resistance value of the resistor 200 is preferably 0.1 to 1.0 Ω and the amplification ratio is preferably in the range of 5 to 20.

Figure 3:
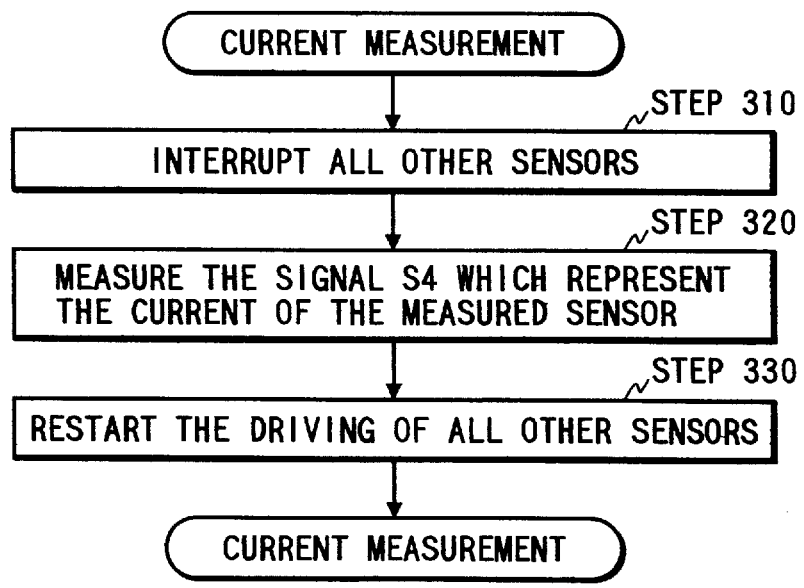
FIG. 3 is a control flow chart of the driving device according to the present invention.

FIG. 3 is a control flow chart of the operation of the driving device according to the present invention, which is executed by the microcomputer 113. In step 310 driving is interrupted so as to stop the currents of the sensors other than the one which is to be measured. Thus, at this time, only the driving signal of the MOS transistor corresponding to the measured sensor remains above the threshold, and the driving signals of the MOS transistors corresponding to all the other sensors are below the threshold. At step 320, the measured signal S4 representing the current value of the measured sensor is converted to a digital value and is measured, and at step 330, driving of all sensors other than the measured sensor is restored before they are affected by the cut off of current.

Figure 4:
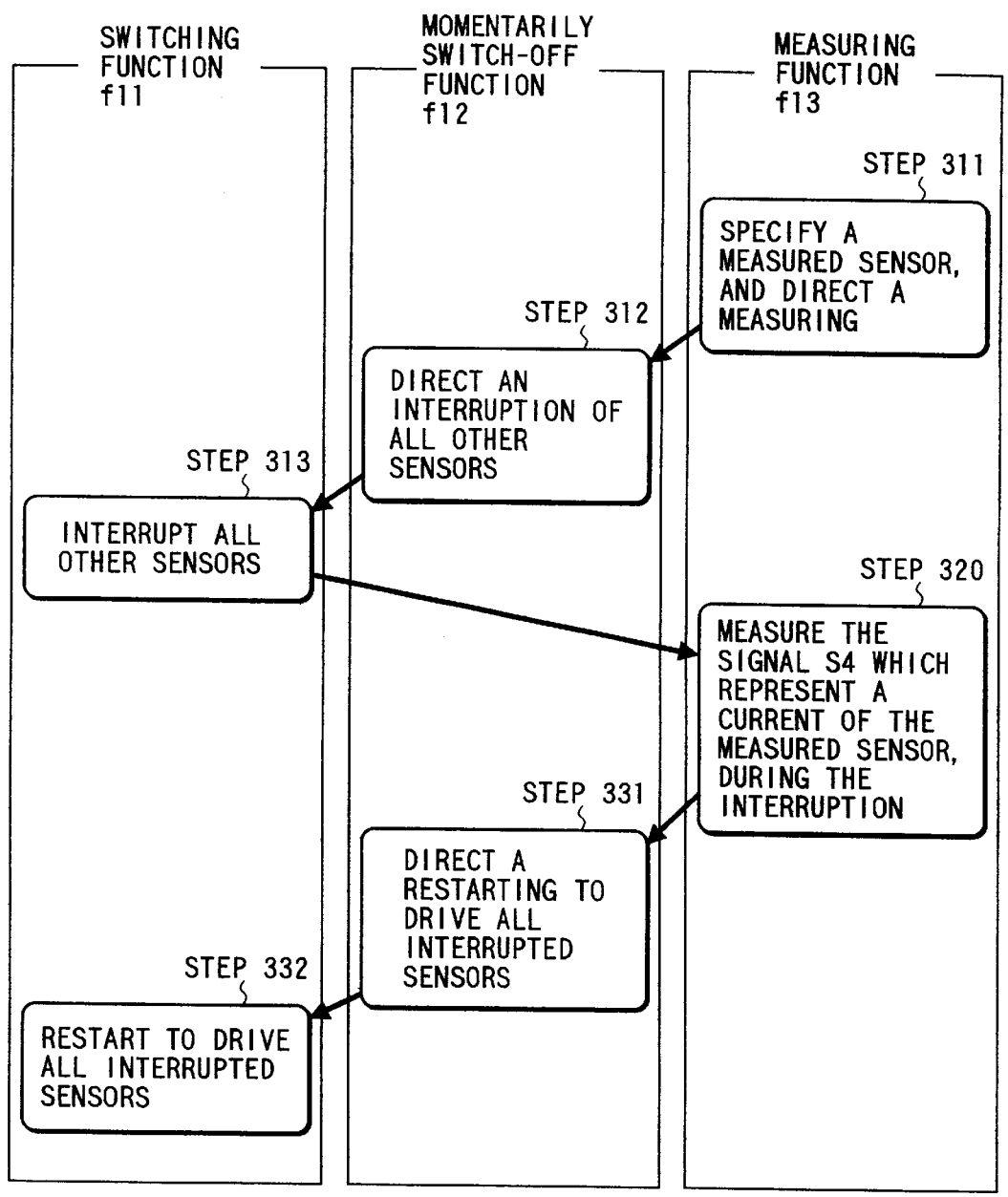
FIG. 4 is an operation flow chart of the driving device according to the present invention.

FIG. 4 is a flow chart which shows the operation of the driving device according to the present invention. The switching function f11, the momentary switch-off function f12 and the measuring function f13 of the microcomputer 113 operate in accordance with the control flow shown in FIG. 3. That is, the Steps 311, 312 and 313 reflect the operation of Step 310, while Steps 331 and 332 collectively constitute Step 330. In the drawing, the operation proceeds in the direction indicated by arrows.

Figure 5:
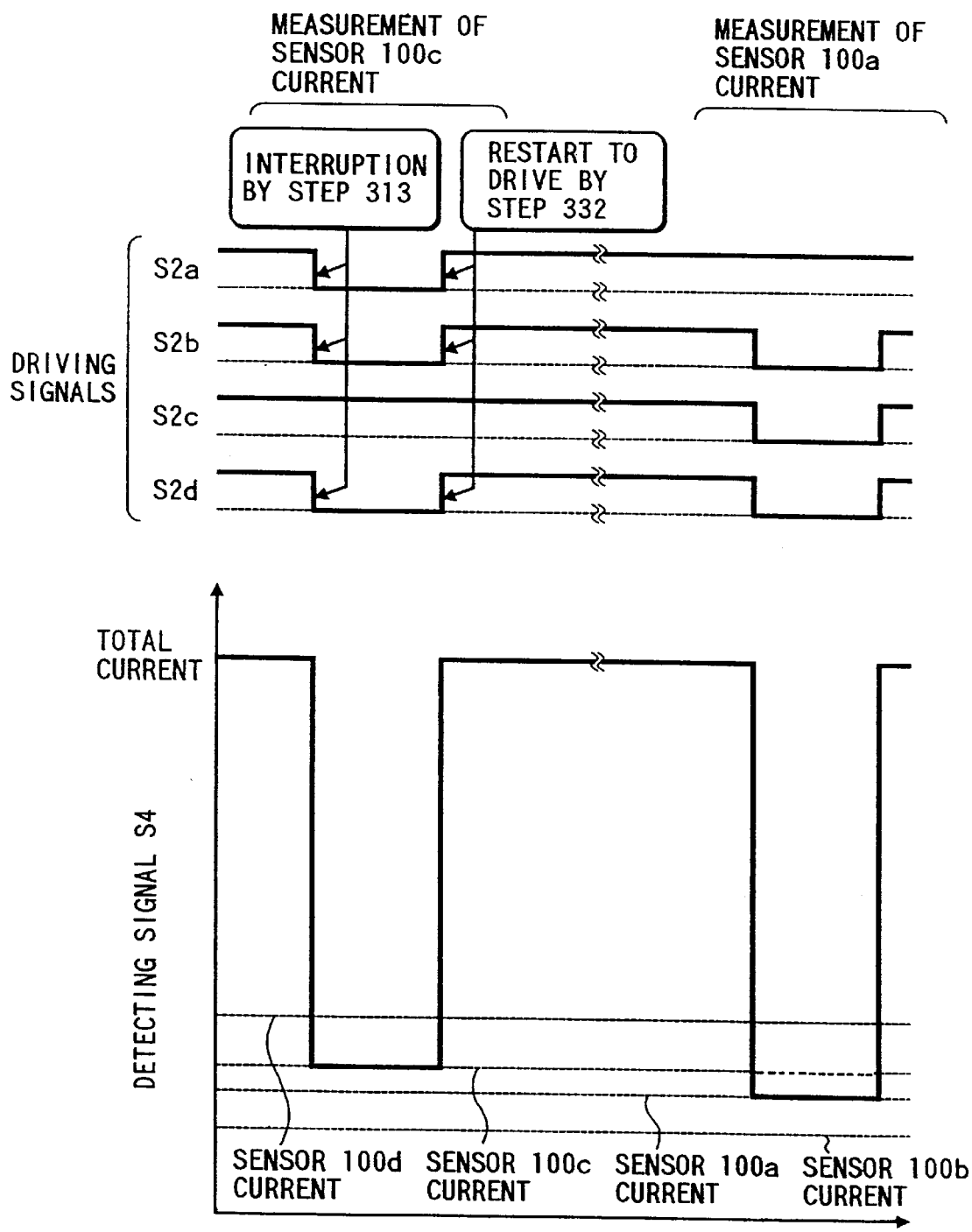
FIG. 5 is a signal waveform diagram which illustrates the operation of the present invention.

FIG. 5 is a signal waveform diagram which shows as an example the sequential measurement of current in the sensors 100c and 100a. In this figure, the broken lines represent the magnitude of the current which flows in sensors 1000a–100d while they are energized. (Since the time period represented by this graph is short, these currents—which in fact vary over time but do no fluctuate rapidly in normal operation—are shown as constant values.) The heavy unbroken line represents the total current which flows to the current-to-voltage converter 112 through the wire S3.

As can be seen in FIG. 5, during the time period $T_1$, the flow of current through the sensors 100a, 100b and 100d is interrupted. That is, the driving signals S2a, S2b and S2d are below the threshold due to interruption at Step 313. At this time, therefore, the measured signal S4 represents the current value of the sensor 100c, which is measured by the microcomputer 113. Thereafter, at the end of $T_1$, the driving signals S2a, S2b and S2d return to the values above the threshold at Step 332 and the currents are restored to the sensors 100a, 100b and 100d. Accordingly, the measured signal S4, too, returns to the total current value as the sum of the current values of the sensors. Measurement of the sensor 100a is made in the same way during the time period $T_2$.

Figure 6:
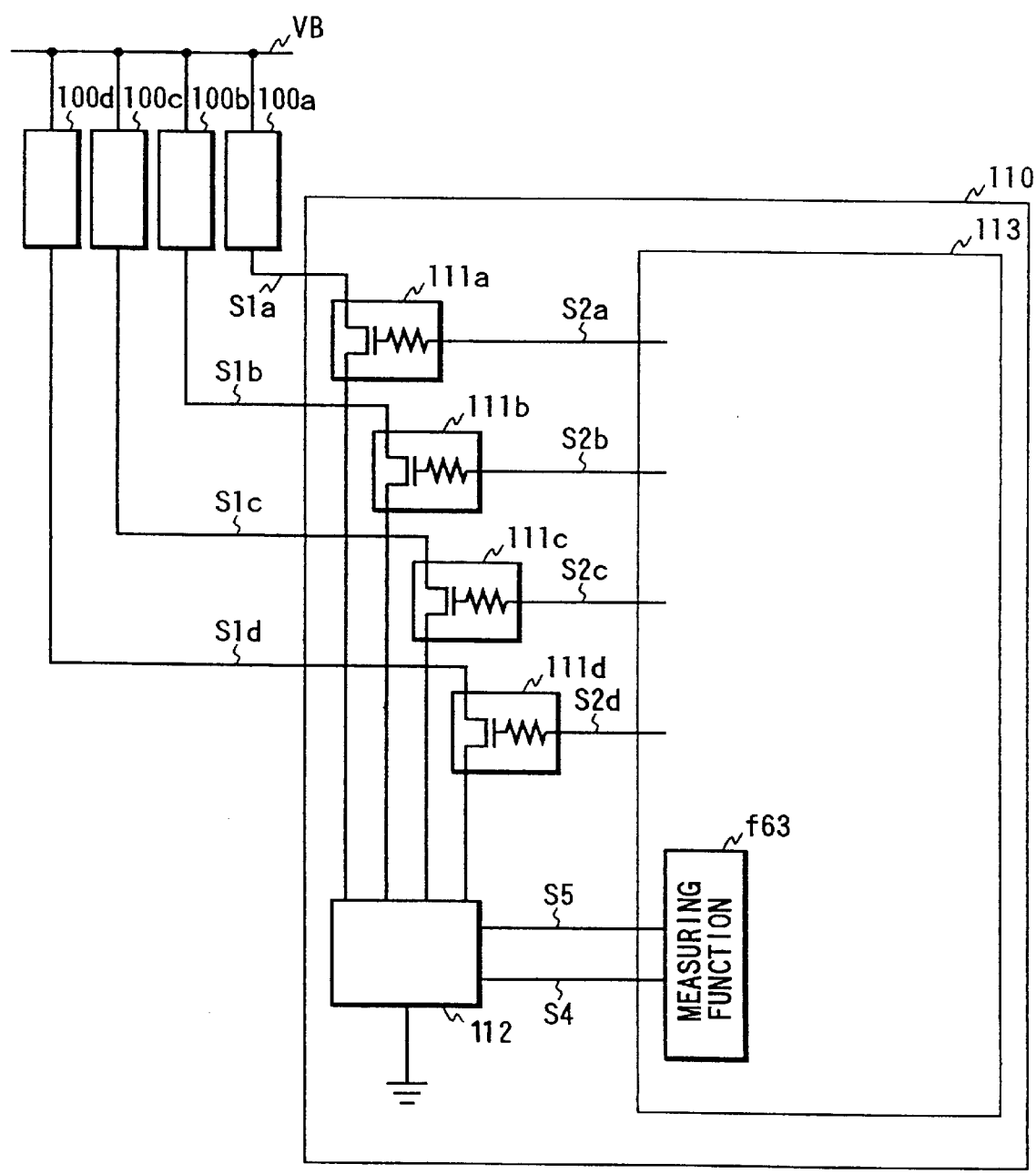
FIG. 6 is a circuit diagram of a driving device according to another embodiment of the present invention.

FIG. 6 is a circuit diagram showing another embodiment of the driving device according to the present invention. In this embodiment, the current of each sensor is input separately to the current-to-voltage converter 112. The microcomputer 113 outputs a control signal S5 that designates the sensor whose current is to be measured. Receiving this signal S5, the current-to-voltage converter 112 outputs the measured signal S4 representing the current value of the designated sensor, which is measured by the measuring function f63 of the microcomputer 113. (In this embodiment, the switching function f11 switches the transistors during the occurrence of an overcurrent and a breakdown, but does not operate in the normal current measurement process.)

Figure 7:
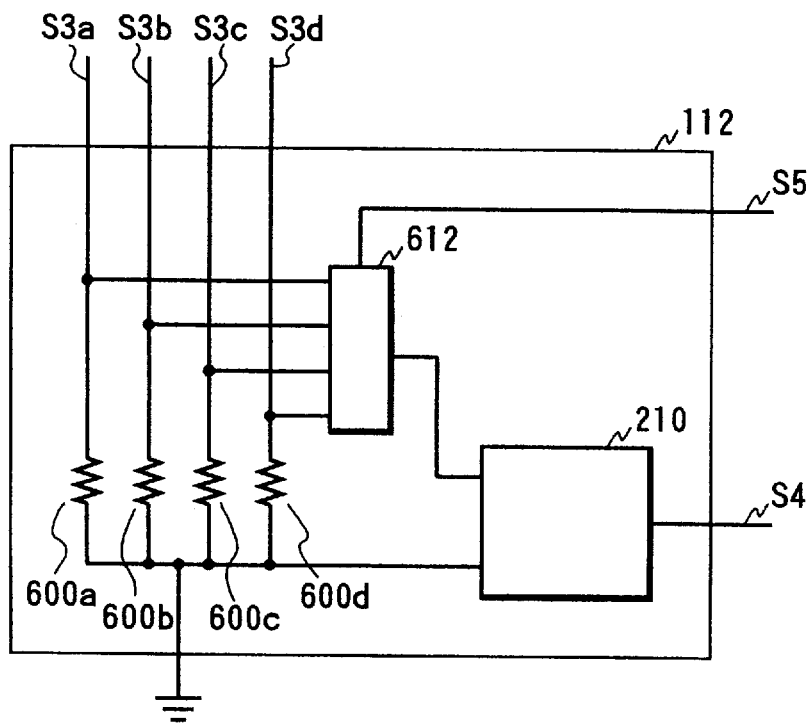
FIG. 7 is a circuit diagram of a current-to-voltage converter of the driving device shown in FIG. 6.

FIG. 7 shows the current-to-voltage converter 612 of the driving device in FIG. 6, which includes resistors 600a, 600b, 600c and 600d associated with the respective sensors 100a–100d. The junction point of resistors 600a–600d is connected to ground and to one input terminal of the differential amplifier 210. The other terminal of the differential amplifier 210 is selectively and sequentially connected to the resistors 600a–600b in according with the control signal S5, through a multiplexer 612a. Accordingly, the current value of the sensor designated by the information S5 is differentially amplified and is outputted to the measured signal S4.

Figure 8:
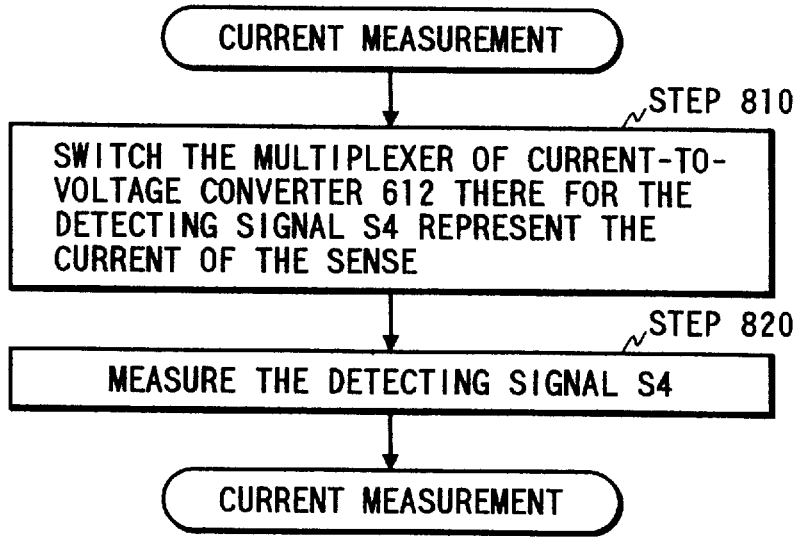
FIG. 8 is a control flow chart of another embodiment of the present invention.

FIG. 8 is a control flow chart of the embodiment of FIG. 7, which shows the processing executed by the microcomputer 113 for current measurement. At Step 810, the control signal S5 designating the sensor is output to the current-to-voltage converter 112 so that the measured signal S4 represents the current value of the designated sensor, and the multiplexer 612 is switched. At the next Step 820, the measured signal S4 representing the current value of the measured sensor is measured. Since the currents to the sensors are not switched off in this embodiment, no influences on the sensors exits.

Figure 9:
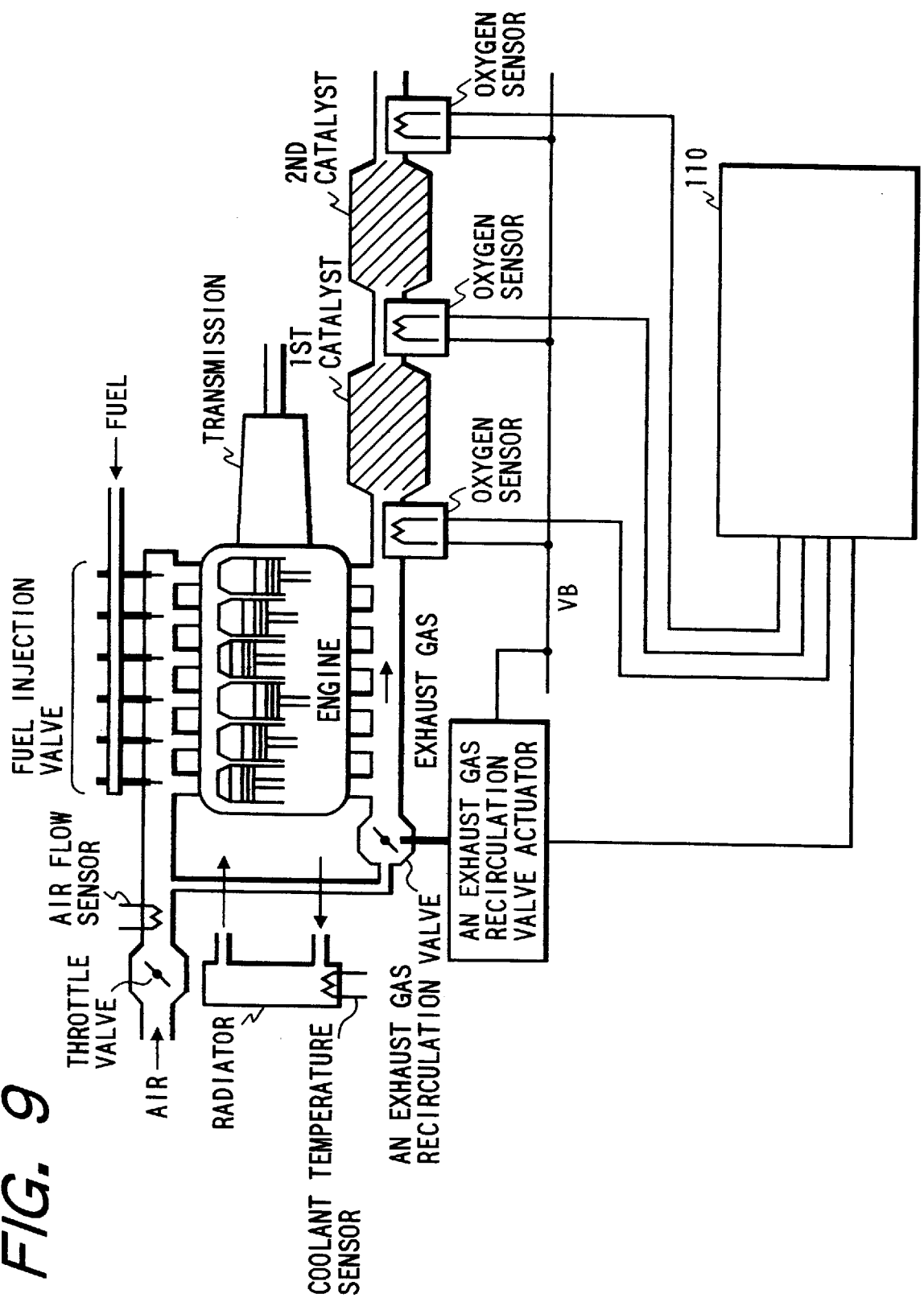
FIG. 9 is a schematic diagram of the present invention applied to an engine control system.

FIG. 9 is a schematic diagram of the present invention in an engine control system. In FIG. 9, oxygen sensors are disposed at three positions (i.e., upstream, downstream and between first and second catalysts), in order to confirm cleanness of an exhaust gas. The driving device of the present invention is applied to these oxygen sensors at the three positions and to an exhaust gas recirculation valve actuator. Since the current of each sensor and the current of the actuator are detected by small circuit, the driving device can be mounted into an engine compartment having a limited internal space.

Because the present invention can measure the currents of a plurality of sensors, etc., by one measuring means, the present invention can reduce the size of the driving device itself and can simplify the circuit.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A device for driving a plurality of at least one of sensors and actuators, comprising:

measuring means for measuring electric current flowing through said plurality of at least one of sensors and actuators;

switching means for selectively energizing said plurality of at least one of sensors and actuators; and a control unit for controlling said switching means to cause said measuring means to measure separately electric current flowing through each of said plurality of at least one of sensors and actuators separately by switching on and off the electric current in said plurality of at least one of sensors and actuators, wherein said sensors are air-fuel ratio sensors disposed on both sides of a catalyst or catalysts in an exhaust channel of an engine, and said actuators are exhaust recirculation valve actuators.

2. Device for driving sensors which are substantially continuously energized while said device is active, said device comprising:

measuring means for measuring an electric current flowing through said sensors;

switching means for selectively enabling and interrupting an electric current flow in said sensors; and a control unit for controlling said switching means periodically to interrupt current flow in all of said sensors other than a selected sensor whose current is to be measured.

3. A device according to claim 2 wherein said control unit sequentially selects a different one of said sensors for current measurement during successive periodic interruptions.

4. A device according to claim 2 wherein said switching means comprises a plurality of semiconductor switches, one such semiconductor switch being connected in series with each of said sensors or actuators.

5. A device according to claim 2 which further comprises a current-to-voltage converter to which current from each of said sensors is selectively input.

6. A device according to claim 2, wherein at least one of said sensors is for measuring an air-fuel ratio.

7. A device for driving sensors and an actuator which are substantially continuously energized while said device is active, said device comprising:

measuring means for measuring electric current flowing through said sensors and said actuator;

switching means for selectively interrupting and enabling a current flow in said sensors and said actuator; and a control unit for controlling said switching means periodically to interrupt current flow in all of said sensors and said actuator other than a selected sensor or a selected actuator whose current is to be measured.

8. A device according to claim 7, wherein said sensors are air-fuel ratio sensors disposed on both sides of a catalyst in an exhaust channel of an engine, and said actuator is an exhaust recirculation valve actuator.

* * * * *